United States Patent [19]

Desu et al.

[11] Patent Number: 5,491,102
[45] Date of Patent: Feb. 13, 1996

[54] METHOD OF FORMING MULTILAYERED ELECTRODES FOR FERROELECTRIC DEVICES CONSISTING OF CONDUCTIVE LAYERS AND INTERLAYERS FORMED BY CHEMICAL REACTION

[75] Inventors: Seshu B. Desu; In K. Yoo; Chi K. Kwok; Dilip P. Vijay, all of Blacksburg, Va.

[73] Assignees: Ceram Incorporated; Sharp Kabushiki Kaisha; Virginia Polytechnic Institute and State University

[21] Appl. No.: 104,861

[22] Filed: Aug. 10, 1993

Related U.S. Application Data

[62] Division of Ser. No. 868,045, Apr. 13, 1992, abandoned.

[51] Int. Cl.[6] .......................... H01L 21/70; H01L 27/00
[52] U.S. Cl. ............................ 437/52; 437/60; 437/919
[58] Field of Search .................... 437/52, 60, 919

[56] References Cited

U.S. PATENT DOCUMENTS

| | | | |
|---|---|---|---|
| 4,982,309 | 1/1991 | Shepherd | 361/321 |
| 5,122,923 | 6/1992 | Matsubara et al. | 361/321 |
| 5,142,437 | 8/1992 | Kammerdiner et al. | |
| 5,155,658 | 10/1992 | Inam et al. | |
| 5,164,808 | 11/1992 | Evans, Jr. et al. | |
| 5,270,298 | 12/1993 | Ramesh | 361/313 |

FOREIGN PATENT DOCUMENTS

| | | |
|---|---|---|
| 0415751A1 | 3/1991 | European Pat. Off. |
| 415750A1 | 3/1991 | European Pat. Off. |

OTHER PUBLICATIONS

Cotton et al., Advanced inorganic chemistry, Interscience, John Wiley & Sons, pp. 51–52.
Fourth International Symposium on Integrated Ferroelectric Films, Mar. 9, 1992, Monterey, CA, USA, Kwok C. K. et al. 'Conducting Oxide Electrodes for Ferroelectric Films' & Integrated Ferroelectrics, vol. 3, No. 2, 1993, USA, pp. 121–130.

*Primary Examiner*—Olik Chaudhuri
*Assistant Examiner*—H. Jey Tsai
*Attorney, Agent, or Firm*—Beaton & Folsom

[57] ABSTRACT

A ferroelectric device is constructed using a bottom electrode composed of a conducting oxide such as $RuO_x$, on a substrate such as silicon or silicon dioxide. A ferroelectric material such as lead zirconate titanate (PZT) is deposited on the bottom electrode, and a conducting interlayer is formed at the interface between the ferroelectric and the electrode. This interlayer is created by reaction between the materials of the ferroelectric and electrode, and in this case would be $Pb_2Ru_2O_{7-x}$. A conductive top layer is deposited over the ferroelectric. This top layer may be a metal, or it may be the same type of materials as the bottom electrode, in which case another interlayer can be formed at the interface. A device constructed in this manner has the property of lower degradation due to fatigue, breakdown, and aging.

8 Claims, 6 Drawing Sheets

CURRENT-VOLTAGE CHARACTERISTICS

Polarization loss by DC voltage stress

METHOD OF FORMING MULTILAYERED ELECTRODES FOR FERROELECTRIC DEVICES CONSISTING OF CONDUCTIVE LAYERS AND INTERLAYERS FORMED BY CHEMICAL REACTION

This is a divisional of application Ser. No. 07/868,045 filed on Apr. 13, 1992, now abandoned.

BACKGROUND OF THE INVENTION

This invention relates to ferroelectric memory devices, and more particularly to multilayer electrodes for nonvolatile dynamic random access memory applications of ferroelectric materials.

Ferroelectrics have long been recognized as potential materials for nonvolatile storage of information. These materials are dielectric in nature and exhibit spontaneous polarization which can be reversed by application of a suitable electric field. The polarization P in these materials responds to an external electric field E in a hysteresis fashion and thereby the materials exhibit bistable properties (two distinct states of polarization) which remain even after removal of the electric field. It is this hysteresis feature that makes ferroelectrics suitable for nonvolatile memory storage. The dielectric nature of ferroelectrics and their ability to display bistable properties can be used to make a ferroelectric capacitor which stores binary digital information based on the polarization state of the material. This opens up the possibilities of integrating a ferroelectric capacitor into the existing Si and GaAs VLSI technology to make a commercial nonvolatile random access memory.

However, several problems need to be overcome before a commercially viable memory product is available. One of the foremost among these problems is the degradation properties of ferroelectric devices. Degradation properties include fatigue, low voltage breakdown, and aging. A common source for these degradation properties is the interaction between defects in the materials and the ferroelectric-electrode interface/grain boundaries in the ferroelectric capacitor.

Considering the problem of fatigue, ferroelectrics are noted to lose some of their polarization as the polarization is reversed. This is known as fatigue degradation, and is one of the prime obstacles to forming high quality ferroelectric films. Fatigue occurs because of defect entrapment at the ferroelectric-electrode interface. Asyrranetric electrode-ferroelectric interfaces and/or non-uniform domain distribution in the bulk can lead to asymmetric polarization on alternating polarity. This results in an internal field difference which can cause effective one-directional movement of defects like vacancies and mobile impurity ions. Since the electrode-ferroelectric interface is chemically unstable, it provides sites of lower potential energy to these defects relative to the bulk ferroelectric thereby causing defect entrapment at these interfaces (see Yoo et al, "Fatigue Modeling of Lead Zirconate Titanate Thin Films," Jour. Material Sci. and Engineering). This entrapment will result in a loss in polarization in the ferroelectric.

To overcome this problem caused by defects, it is necessary to control the defect concentration, defect migration to the interface, defect entrapment at the interface, and the state of the interface itself. Lattice mismatch, poor adhesion, and large work function differences between the electrode and the ferroelectric causes the interface to be chemically unstable. Therefore, it is necessary to choose an appropriate electrode which can reduce the lattice mismatch, work function differences, and the adhesion problem at the interface. The existing, commonly-used, metal electrodes such as Pt, Au, etc., do not satisfy these criteria because of the large differences in crystal structures between the electrode (metal) and the ferroelectric (ceramic), and because of the work function differences. To control the defect migration and entrapment it is necessary to reduce the abrupt compositional gradient between the electrode and the ferroelectric.

SUMMARY OF THE INVENTION

It is a general object of the invention to provide an electrode system which can overcome the degradation problems in ferroelectric capacitors. It is a more specific object of this invention to provide an electrode system which can overcome the fatigue problems in the ferroelectric capacitors. It is another specific object of this invention to provide an electrode system which can overcome low voltage breakdown problems in ferroelectric capacitors. It is another specific object of this invention to provide an electrode system which can overcome the aging problems in ferroelectric capacitors.

According to one embodiment of the present invention, these and other objects are obtained by using a multilayer electrode system of ceramic electrodes. Ceramic electrodes have crystal structures similar to the ferroelectrics. This reduces the lattice mismatch and the work function differences between the electrode and the ferroelectric. Therefore, the interface is more stable. By using a multilayer electrode system of ceramic electrodes as disclosed herein, the compositional gradient between the ferroelectric and the electrode is reduced. Hence, the interface state and the compositional gradient will be altered so as to reduce the migration of defects and their entrapment thereafter.

In a particular embodiment of the invention, a ferroelectric device is constructed using a bottom electrode composed of a conducting oxide such as $RuO_x$, on a substrate such as silicon or silicon dioxide. A ferroelectric material such as lead zirconate titanate is deposited on the bottom electrode, and a conducting interlayer is formed at the interface between the ferroelectric and the electrode. This interlayer is formed by reaction between the ferroelectric and electrode, and in this case would be $Pb_2Ru_2O_{7-x}$. A conductive top layer is deposited over the ferroelectric. This top layer may be a metal, or it may be the same kind of materials as the bottom electrode (conducting oxide), in which case another interlayer can be formed at the interface. A device constructed in this manner has the property of lower degradation due to fatigue, breakdown, and aging.

BRIEF DESCRIPTION OF THE DRAWINGS

The novel features believed characteristic of the invention are set forth in the appended claims. The invention itself, however, as well as other features and advantages thereof, will be best understood by reference to the detailed description of a specific embodiment, when read in conjunction with the accompanying drawings, wherein:

DESCRIPTION OF SPECIFIC EMBODIMENTS

Figure 1:
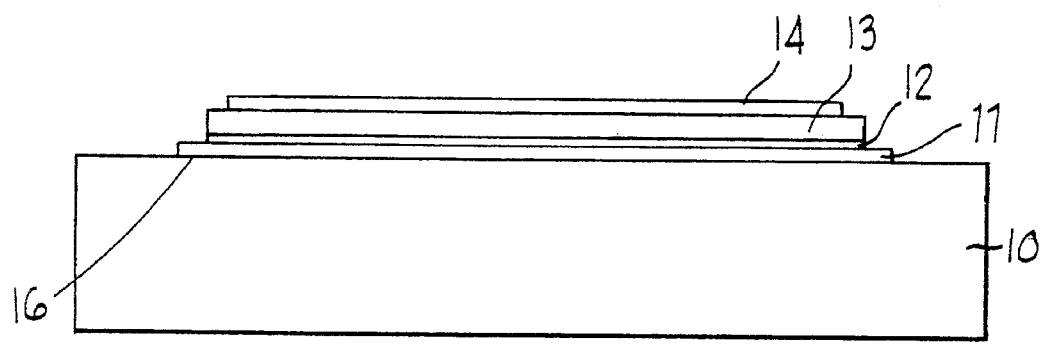
FIG. 1 is an elevation view in section of a ferroelectric device according to one embodiment of the invention.

Referring to FIG. 1, a ferroelectric device is shown according to one embodiment of the invention. A substrate 10 has a bottom electrode 11 deposited thereon to act as a conductor for making a connection to other circuit elements in an integrated circuit. The substrate 10 may be silicon, a layer of silicon oxide over a silicon chip, gallium arsenide, etc. Of course, the substrate 10 may be a multilayer structure having various circuit elements formed on a silicon chip having layers of silicon oxide, polysilicon, implanted silicon layers, etc., to form a complex integrated circuit. An interlayer 12 is formed on the bottom electrode 11 to reduce degradation of the ferroelectric material, as will be described, providing a major feature of the invention. This interlayer 12 is a conducting compound formed by reaction of the materials of the ceramic bottom electrode 11 and the ferroelectric. A layer 13 of ferroelectric material such as lead zirconate titanate (PZT) is deposited over the interlayer 12 by a method such as that disclosed in copending application Ser. No. 848,389, filed Mar. 9, 1992, for "Ferroelectric Thin Films Made by Metallorganic Chemical Vapor Deposition," by Seshu B. Desu et al, assigned to the assignee of this invention. A top electrode 14 is deposited over the ferroelectric material 13 to provide a connection to other elements of the integrated circuit. This top electrode is composed of a metal such as Pd, Au, or Ag. In an alternative embodiment as illustrated in FIG. 2, the top electrode 14 is composed of the same type of material as the bottom electrode 11 (conducting oxide) and another interlayer 15 is formed between the ferroelectric material 13 and the top electrode 14, thus providing the same function as the interlayer 12 at the interface between ferroelectric and bottom conductor; the construction of the device of FIG. 2 is otherwise the same as that of FIG. 1.

Existing ferroelectric capacitors are constructed with a ferroelectric material sandwiched between two metallic electrodes, i.e., without the interlayers 12 or 15. The disadvantage in using such a capacitor structure lies in the degradation of the ferroelectrics for the reasons discussed above.

Figure 2:
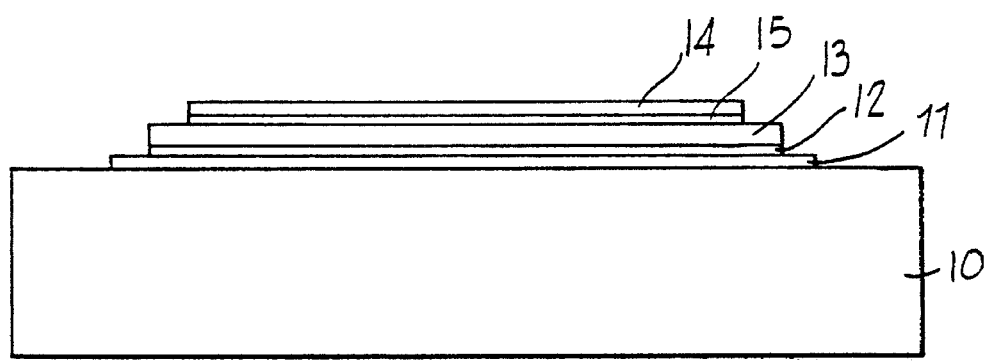
FIG. 2 is an elevation view in section like FIG. 1 of a ferroelectric device according to another embodiment of the invention.

In the multilayer electrode structure according to the invention, seen in FIGS. 1 and 2, the bottom electrode 11 is a ceramic conducting oxide ($MO_x$) such as $RuO_x$ (Ruthenium oxide), $ReO_x$ (Rhenium oxide), $RhO_x$ (Rhodium oxide), $IrO_x$ (Iridium oxide), $OsO_x$ (Osmium oxide), etc., as listed in Table 1. The ferroelectric material 13, in general, possesses the perovskite crystal structure which can be represented by the chemical formula $ABO_3$. The A element is a large cation like Ba, Pb, Sr, Bi, etc., and the B element a smaller cation like Ti, Nb, etc., as listed in Table 1. In the ferroelectric phase the perovskite structure usually adopts the tertragonal, orthorhombic or rhombohedral structures. Since the electrode 11 and the ferroelectric 13 are ceramic oxides they have very similar crystal structures. The lattice mismatch and the work function differences are reduced. The top electrode can either be the same as the bottom electrode 11 as in FIG. 2 (symmetric configuration) or an electrode of different material as in FIG. 1 (asymmetric configuration). In the symmetric configuration the interlayers 12 and 15 can be formed by processing the electrode/ferroelectric/electrode ($MO_x/ABO_3/MO_x$) system at elevated temperatures while in the asymmetric configuration the $MO_x/ABO_3$ system is annealed initially to form the desired ferroelectric phase in layer 13 and in interlayer 12, followed by the deposition of the top electrode 14. The top electrode 14 in the case of FIG. 1 can be a metal electrode and the interlayer 12 is formed only between the bottom electrode 11 and the ferroelectric layer 13. The formation of the interlayer 12 or 15 takes place by reaction between the ferroelectric and the electrode at elevated temperatures. The temperature at which the interlayer 12 or 15 forms depends on the ferroelectric and electrode materials under consideration. The interlayer can be represented by the general formula $A_2M_2O_{7-x}$. For example, consider the case of Lead Zirconate Titanate ($PbZr_xTi_{1-x}O_3$) ferroelectric on $RuO_x$ electrode. Annealing this structure at an elevated temperature (500° C.) results in the formation of interlayer Lead Ruthenate ($Pb_2Ru_2O_6$) due to reaction between PbO (from the ferroelectric) and the $RuO_x$ electrode.

The interlayer 12 or 15 reduces the gradient in chemical potential between the electrode 11 or 14 and the ferroelectric 13 for the movement and entrapment of defects. Additionally, the interlayer materials usually adopt a pyrochlore structure and are conducting in nature. The base electrode 11 and the conducting interlayer 12 together constitute the multilayer electrode system. The bottom electrodes 11 are usually deposited on a substrate 10 composed of Si, $Si/SiO_2$ (with a metallic interlayer of Ti or Ni for better adhesion), sapphire, MgO or $Al_2O_3$ substrates. The choice of the substrate 10 is solely dependent on the final application of the ferroelectric device and this list of substrates is not exhaustive. For nonvolatile memory applications Si or $Si/SiO_2$ substrates are generally used. The deposition of the electrodes and layers of FIGS. 1 and 2 are accomplished by any of the common thin film deposition techniques such as sputtering, chemical vapor deposition, sol-gel, metallorganic decomposition, electron beam evaporation, etc. As an example, $RuO_x$ has been deposited on various substrates by the above mentioned techniques (see Krusin-Elbaum et at, "Conducting Transition Metal Oxides: Possibilities for $RuO_2$ in VLSI Metallization," J. Electrochem. Soc.: Solid State Science and Technology, Vol. 135, No. 10, 1988, p. 2610, and see Green et al, "Chemical Vapor Deposition of Ruthenium and Ruthenium Dioxide Films," J. Electrochem. Soc., Vol. 132, p. 2677, 1985).

The ferroelectric material 13 is deposited on top of the bottom electrode 11 by any viable thin film deposition technique which can provide good uniformity and stoichiometry in the film. The common deposition techniques used are sol-gel, MOCVD, sputtering, etc. To obtain the required ferroelectric properties, the material must possess the desired structure which is usually the perovskite structure. This structure is obtained either during the deposition itself or by post deposition annealing depending on the kind of deposition process used. The above-mentioned copending application Ser. No. 848,389 gives an example of a deposition method which may be used for the layer 13 of ferroelectric material.

Finally, the top electrodes such as Pd, Au, Ag, Pt, etc., are deposited by using any of the common thin film deposition techniques like vacuum evaporation, sputtering, etc. The thickness, uniformity, and composition of the ferroelectric material and the electrodes are process dependent and the processing conditions can be varied to obtain the desired values.

An example embodiment of the invention, using PZT as the ferroelectric material, $RuO_x$ as the bottom electrode, Pd as the top electrode and $Pb_2Ru_2O_{7-x}$ as the interlayer, is used as a test vehicle. The $RuO_x$ was deposited as the bottom electrode 11 on $Si/SiO_2$ substrates 10 with a Ti interlayer 16 (for better adhesion of the electrode 11 to the substrate 10). Other samples had the $RuO_x$ deposited on Si substrates 10 separately by reactive ion sputtering. The sputtering was performed at 150° C. in a vacuum of $2.0 * 10^{-4}$ torr. The ferroelectric layer 13 composed of $PbZr_xTi_{1-x}O_3$ (x=0.53) was then deposited on the bottom electrode 11 through the sol-gel method and spin coating. Samples were annealed at temperatures between 400° C. to 700° C. in intervals of 50° C. in a controlled $O_2$ atmosphere. X-ray diffraction (XRD) studies were then conducted on the annealed samples to identify the phases present.

Figure 3:
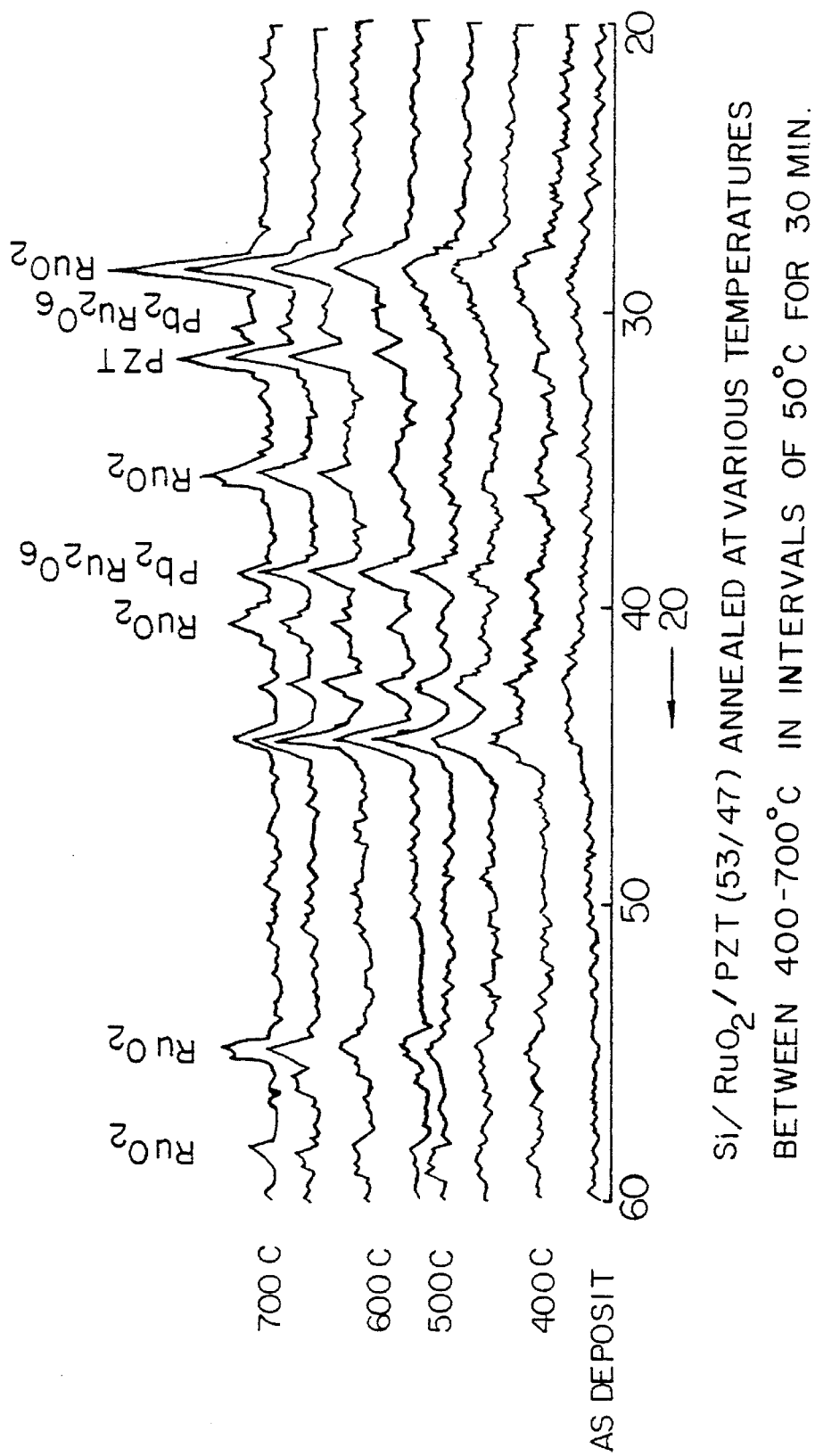
FIG. 3 is an XRD pattern of a ferroelectric device using the example composition of $Si/RuO_x/PZT$, annealed at various temperatures between 400° C. and 700° C. in 50° C. intervals for 30 minutes in $O_2$ atmosphere.

FIG. 3 shows the X-ray diffraction (XRD) pattern of the $Si/RuO_2/PZT$ samples at various annealing temperatures. It is evident from the patterns that the PZT perovskite phase starts forming around 550° C. and the formation is complete at 600° C. This indicates that the complete ferroelectric phase forms at 600° C. for this system. Also evident from the XRD pattern is formation of the pyrochlore $Pb_2Ru_2O_{7-x}$ phase at around 500° C. This is the interlayer that forms between the electrode and the ferroelectric. This layer is conducting and has a resistivity of the order $2*10^{-4}$ ohm cm (see Longo et al, "$Pb_2M_2O_{7-x}$—Preparation and Properties of Oxygen Deficient Pyrochlores," Mat. Res. Bull., Vol. 4, 1969, p. 191).

Palladium (Pd) top electrodes 14 were then deposited on top of the PZT films 13 by electron beam evaporation under $1.5*10^{-7}$ torr vacuum.

Figure 4:
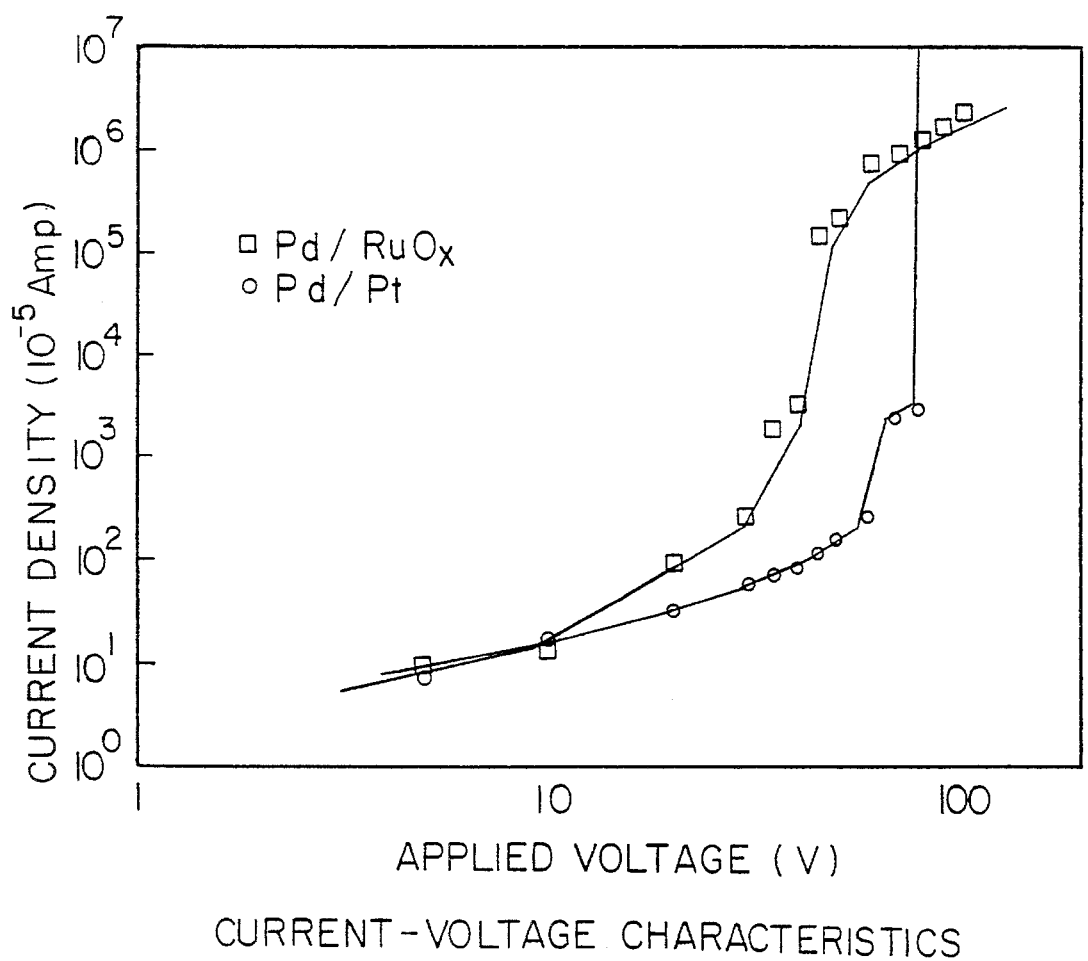
FIG. 4 is a diagram of current versus voltage for comparison of the breakdown voltages of PZT on bottom electrodes composed of $RuO_x$ and Pt.
Figure 5:
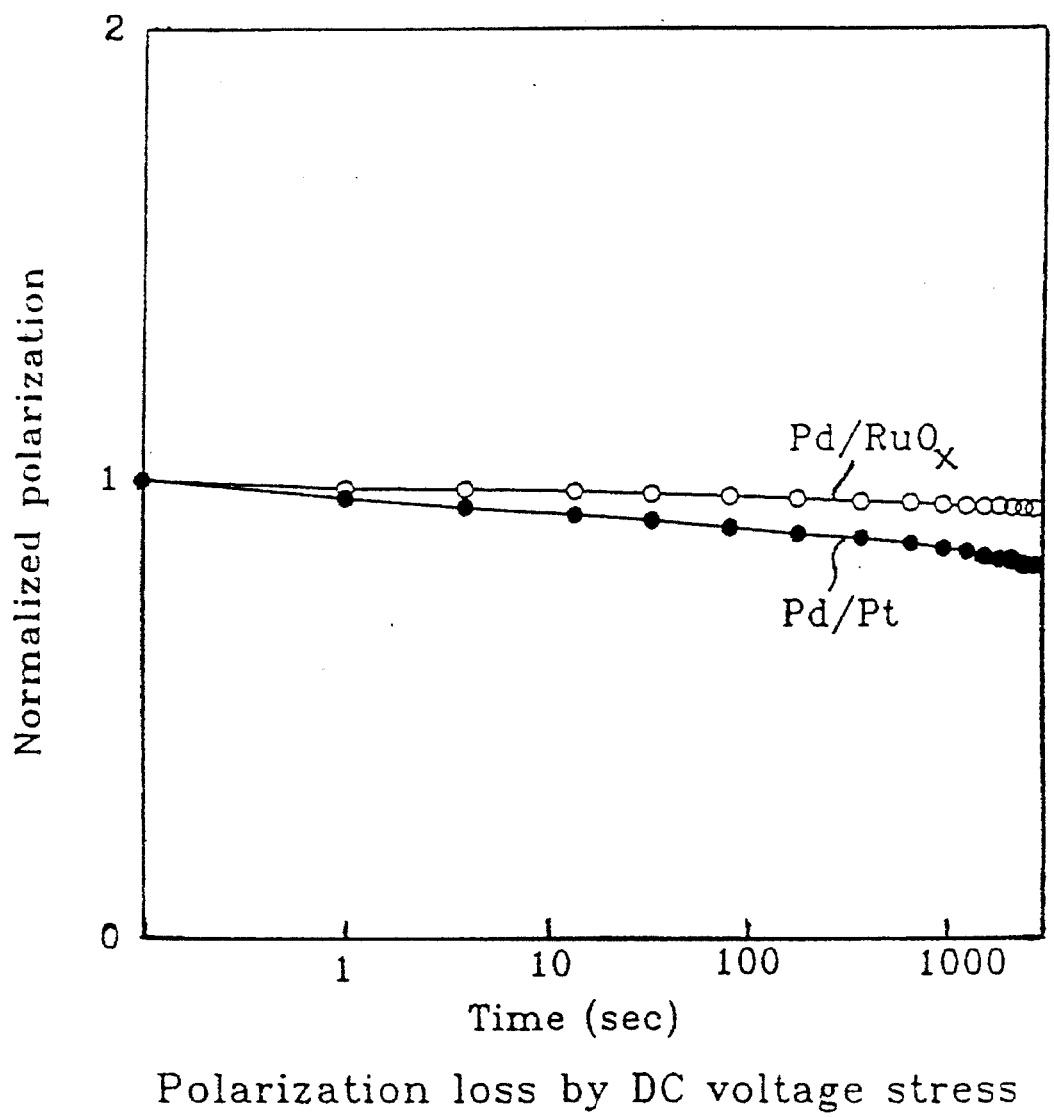
FIG. 5 is a diagram of polarization versus time, illustrating accelerated aging properties of PZT on bottom electrodes of $RuO_x$ and Pt.
Figure 6:
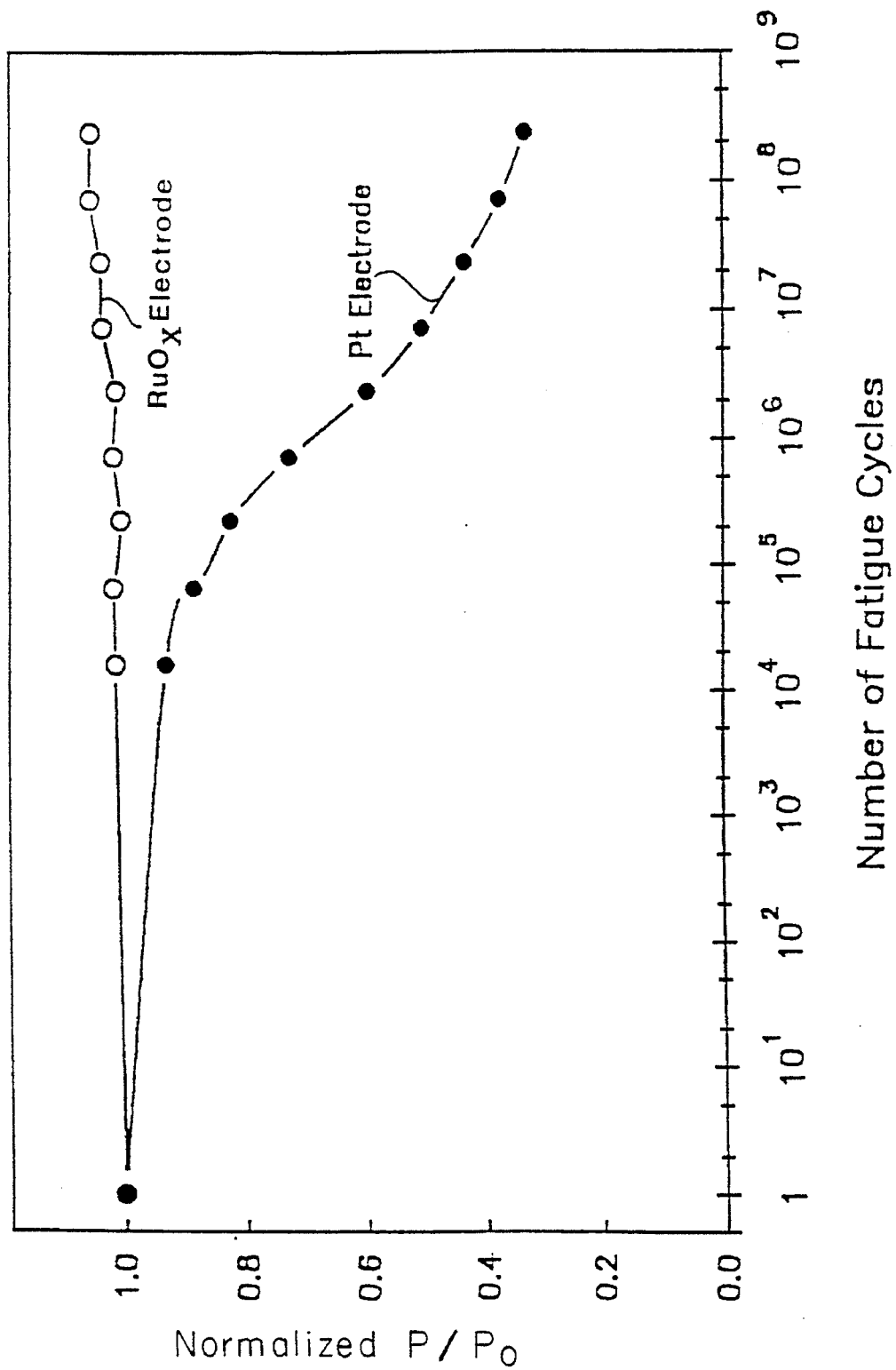
FIG. 6 is a diagram of normal fatigue properties of PZT on electrodes of $RuO_x$ and Pt, under an alternating pulse.
Figure 7:
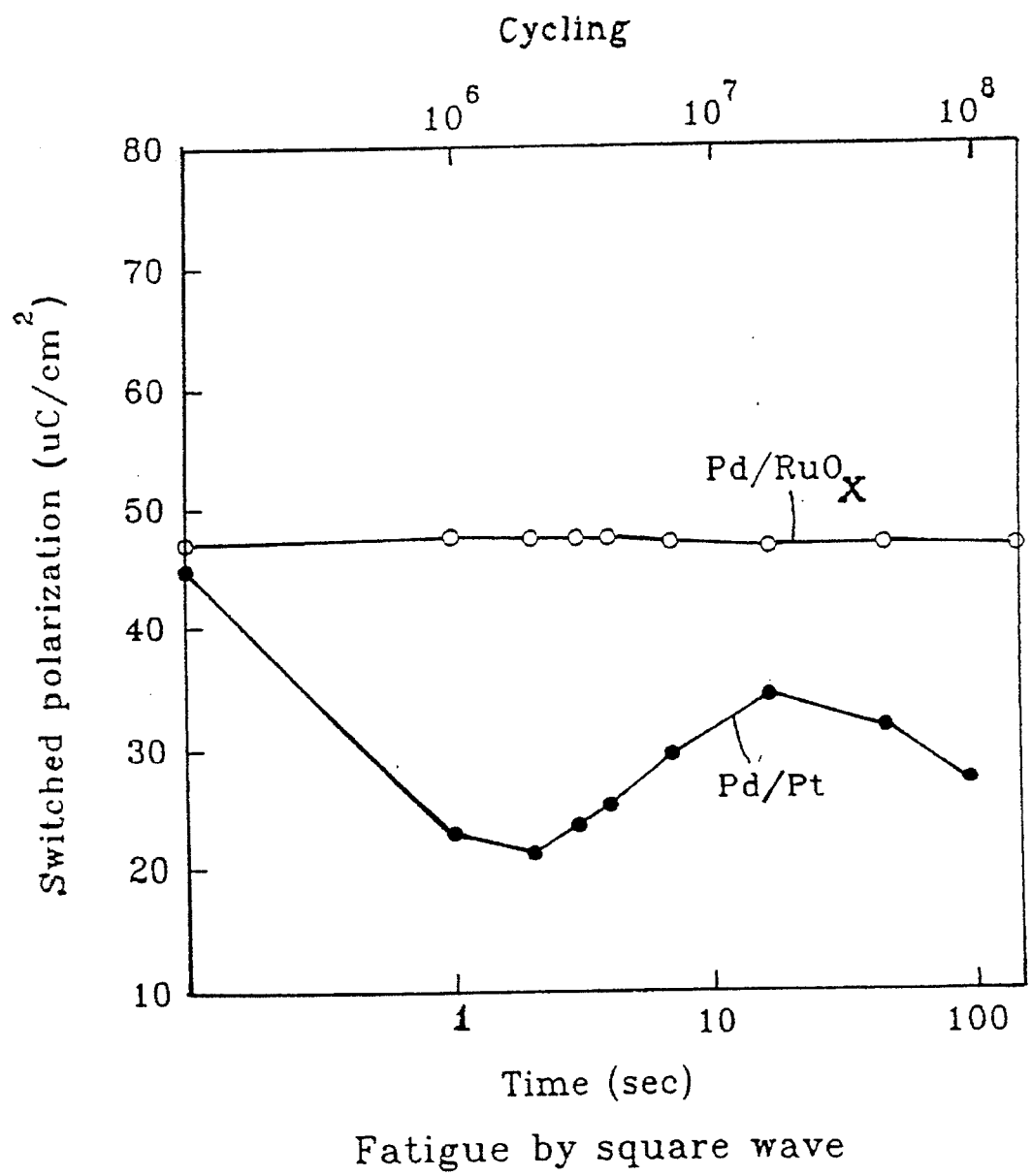
FIG. 7 is a diagram of polarization versus time, illustrating the accelerated fatigue properties of PZT on electrodes of $RuO_x$ and Pt, under an alternating pulse.

Devices made as described above, when tested for fatigue, breakdown voltage and accelerated aging, exhibit improved properties. In this testing, the electrical properties of PZT thin films on $RuO_x$ (ceramic) and Pt(metal) bottom electrodes with $Si/SiO_2$ as the substrate and Pd as the top electrode are compared for the same composition (x=0.53) and annealing conditions (600° C.), with the results shown in FIG. 4, where the breakdown voltages of PZT on the metal and ceramic electrodes are compared. For this case a 47KfΩ resistor was used in series to protect the test equipment. The breakdown field for the Pt/PZT system is lower than the $RuO_x/PZT$ system. FIG. 5 compares the effect of accelerated aging in PZT on $RuO_x$, and Pt electrodes. Under a DC stress field with the 47KΩ series resistor, the sample on $RuO_x$ shows very little loss in polarization while in the Pt/PZT sample the loss in polarization with time (aging/fatigue) is significant. The normal fatigue properties of PZT films on these electrodes under a test field 150 KV/cm and using a pulse wave is shown in FIG. 6 and the accelerated fatigue properties at high frequency are shown in FIG. 7. Under both these conditions the film does not show any fatigue on the ceramic $RuO_x$ electrode. However, the film fatigues quite severely on the metal (Pt) electrode.

The data presented in FIGS. 4–7 illustrate that PZT shows minimal fatigue and aging and higher breakdown voltages on $RuO_x$ electrodes, when compared to Pt electrodes. More generally, these figures illustrate that ferroelectrics have minimal degradation problems on ceramic multilayer electrodes according to the invention. This is true for any embodiment of the system, i.e., for any ceramic bottom electrode 11 and ferroelectric 13 and under any set of processing conditions of the electrode and the ferroelectric (deposition technique, composition of the film and annealing conditions), provided an interlayer 12 of conducting oxide forms between the ferroelectric film 13 and the ceramic electrode 11. For example, in another specific embodiment of the system, $BaTiO_3$ is used as the ferroelectric layer 13, $RuO_x$ as the electrodes 12 and 14, and $Ba_2Ru_2O_{7-x}$ as the interlayers 12 and 15. In yet another specific embodiment of the system, $Ba_{1-x}Sr_xTiO_3$ is used as the ferroelectric, $RuO_x$ as the electrodes 11 and 14, and $Ba_{1-x}Sr_xRu_2O_{7-y}$ as the interlayers 12 and 15. Some examples of the ceramic electrodes 11 or 14, the ferroelectrics layers 13 used and the interlayers 12 or 15 that can be formed are shown in Table 1, and the materials enumerated in Table 1 are by no means exhaustive. The list of ferroelectric materials is quite large. It is possible to form a number of $AB'B''O_3$ and $AA'BO_3$ type of substitutional compounds for use as the ferroelectric 13. $PbZr_xTi_{1-x}O_3$ and $Ba_{1-x}Sr_xTiO_3$ are good examples of these types of compounds. The interlayer that forms may adopt the $AMO_3$ kind of structure. For example, $SrTiO_3$ forms perovskite $SrRuO_3$ as the interlayer on $RuO_x$ electrodes. As stated earlier, any viable process can be used for deposition of the films and electrodes. For example, the process and reaction disclosed in the above-mentioned copending application Ser. No. 848,389, may be used to deposit the ferroelectric films. The annealing temperatures for the various ferroelectric materials to produce the proper phase and the interlayers 12 and 15 are in the range of about 400° to 700° C., and would be selected by using a number of temperatures as discussed above then by the X-ray diffraction (XRD) technique (see FIG. 3) to point at which the proper ferroelectric phase is completed is determined.

While the invention has been described with reference to a specific embodiment, the description is not meant to be construed in a limiting sense. Various modifications of the disclosed embodiment, as well as other embodiments of the invention, will be apparent to persons skilled in the art upon reference to this description. It is therefore contemplated that the appended claims will cover any such modifications or embodiments which fall within the true scope of the invention.

TABLE 1

| CERAMIC ELECTRODE | FERROELECTRIC | INTERLAYER |
|---|---|---|
| $RuO_x$ | $PbTiO_3$ | $Pb_2Ru_2O_{7-x}$ |
| | PZT | $Pb_2Ru_2O_{7-x}$ |
| | $BaTiO_3$ | $Ba_2Ru_2O_{7-x}$ |
| | $SrTiO_3$ | $SrRuO_3$ |
| | $Ba_{1-x}Sr_xTiO_3$ | $Ba_{1-x}Sr_xRu_2O_{7-y}$ |
| | $Bi_4Ti_3O_{12}$ | $Bi_2Ru_2O_{7-x}$ |
| | $Sr_2Nb_2O_7$ | $SrRuO_3$ |
| | $La_2Ti_2O_7$ | $La_2Ru_2O_{7-x}$ |
| ReOx | $PbTiO_3$ | $Pb_2Re_2O_{7-x}$ |
| | PZT | $Pb_2Re_2O_{7-x}$ |
| | $BaTiO_3$ | $Ba_2Re_2O_{7-x}$ |
| | $SrTiO_3$ | $SrReO_3$ |
| | $Ba_{1-x}Sr_xTiO_3$ | $Ba_{1-x}Sr_xRe_2O_{7-y}$ |
| | $Bi_4Ti_3O_{12}$ | $Bi_2Re_2O_{7-x}$ |
| | $Sr_2Nb_2O_7$ | $SrReO_3$ |
| | $La_2Ti_2O_7$ | $La_2Re_2O_{7-x}$ |
| RhOx | $PbTiO_3$ | $Pb_2Rh_2O_{7-x}$ |
| | PZT | $Pb_2Rh_2O_{7-x}$ |
| | $BaTiO_3$ | $Ba_2Rh_2O_{7-x}$ |
| | $SrTiO_3$ | $SrRhO_3$ |

TABLE 1-continued

| CERAMIC ELECTRODE | FERROELECTRIC | INTERLAYER |
|---|---|---|
| | $Ba_{1-x}Sr_xTiO_3$ | $Ba_{1-x}Sr_xRh_2O_{7-y}$ |
| | $Bi_4Ti_3O_{12}$ | $Bi_2Rh_2O_{7-x}$ |
| | $Sr_2Nb_2O_7$ | $SrRhO_3$ |
| | $La_2Ti_2O_7$ | $La_2Rh_2O_{7-x}$ |
| IrOx | $PbTiO_3$ | $Pb_2Ir_2O_{7-x}$ |
| | PZT | $Pb_2Ir_2O_{7-x}$ |
| | $BaTiO_3$ | $Ba_2Ir_2O_{7-x}$ |
| | $SrTiO_3$ | $SrIrO_3$ |
| | $Bi_4Ti_3O_{12}$ | $Bi_2Ir_2O_{7-x}$ |
| | $Sr_2Nb_2O_7$ | $SrIrO_3$ |
| | $La_2Ti_2O_7$ | $La_2Ir_2O_{7-x}$ |
| | $Ba_{1-x}Sr_xTiO_3$ | $Ba_{1-x}Sr_xIr_2O_{7-y}$ |
| OsOx | $PbTiO_3$ | $Pb_2Os_2O_{7-x}$ |
| | PZT | $Pb_2Os_2O_{7-x}$ |
| | $BaTiO_3$ | $Ba_2Os_2O_{7-x}$ |
| | $SrTiO_3$ | $SrOsO_3$ |
| | $Bi_4Ti_3O_{12}$ | $Bi_2Os_2O_{7-x}$ |
| | $Sr_2Nb_2O_7$ | $SrOsO_3$ |
| | $La_2Ti_2O_7$ | $La_2Os_2O_{7-x}$ |
| | $Ba_{1-x}Sr_xTiO_3$ | $Ba_{1-x}Sr_xOs_2O_{7-y}$ |

What is claimed is:

1. A method of making a ferroelectric device comprising the steps of:

a) depositing a conducting oxide on a substrate to provide a ceramic electrode;

b) depositing a layer of ferroelectric material on said ceramic electrode to produce an interface between the ferroelectric layer and the ceramic electrode;

c) annealing said electrode and said ferroelectric layer to react the conducting oxide with the ferroelectric layer to produce a conductive interlayer at the interface; and d) depositing a conductive top electrode over said layer of ferroelectric material.

2. A method according to claim 1 wherein said ferroelectric material is selected to react with said ceramic electrode from the group consisting of lead zirconate titanate and ferroelectric compounds of the form $ABO_3$ and $AB'B''O_3$, where A belongs to the group of Pb, Ba, Bi, Li, La, or Sr, and where B belongs to the group of Ti, Nb, Ta, Mg, Sn, W, or Zr.

3. A method according to claim 1 wherein said ceramic electrode is a conducting oxide selected to react with said ferroelectric layer from the group consisting of $RuO_x$, $ReO_x$, $RhO_x$, $IrO_x$, and $OsO_x$.

4. A method according to claim 1 wherein said conductive interlayer includes a conducting compound selected from the group consisting of the compounds of the form $A_2M_2O_6$, $A_2M_2O_{7-x}$ and $AMO_3$ which is formed by the reaction between the ceramic electrode and said ferroelectric material, where A is selected from the group consisting of Pb, Ba, Sr, and La, and where M is selected from the group consisting of Ru, Re, Rh, Ir, and Os.

5. A method according to claim 4 wherein said ceramic electrode is a conducting oxide selected from the group consisting of $RuO_x$, $ReO_x$, $RhO_x$, $IrO_x$, and $OsO_x$, and wherein said ferroelectric material is selected from the group consisting of lead zirconate titanate and ferroelectric compounds of the form $ABO_3$, where A is from the group consisting of Pb, Ba, Bi, Li, La, and Sr, and where B is from the group consisting of Ti, Nb, Ta, Mg, Sn, W, and Zr, so that the ceramic electrode will react with the ferroelectric layer to produce the conductive interlayer.

6. A method according to claim 1 further including the step of forming a second interlayer located between said layer of ferroelectric material and said top layer, said second interlayer being composed of a conducting compound.

7. A method according to claim 1 wherein said substrate is composed of a material selected from the group consisting of silicon, sapphire, silicon oxide, silicon with a silicon oxide coating, and gallium arsenide.

8. A method according to claim 1 wherein said steps of depositing are performed by a technique of the class of sputtering, CVD, sol-gel, electron beam evaporation, metallorganic decomposition, and laser ablation.

* * * * *